United States Patent [19]

Sato et al.

[11] 4,284,713

[45] Aug. 18, 1981

[54] IMAGE FORMING METHOD

[75] Inventors: Masamichi Sato; Itsuo Fujii, both of Asaka, Japan

[73] Assignee: Fuji Photo Film Co., Ltd., Minami-ashigara, Japan

[21] Appl. No.: 666,996

[22] Filed: Mar. 15, 1976

[30] Foreign Application Priority Data

Mar. 14, 1975 [JP] Japan ................... 50-31479

[51] Int. Cl.$^3$ ................... G03C 5/00
[52] U.S. Cl. ................... 430/323; 156/643; 156/646; 204/192 EC; 430/296; 430/321; 430/327; 430/328; 430/5; 430/329; 430/330
[58] Field of Search ............ 204/192, 192 E, 192 EC, 204/129.1; 96/36, 50, 35.1; 156/7, 643, 646

[56] References Cited

U.S. PATENT DOCUMENTS

| | | | |
|---|---|---|---|
| 1,472,048 | 10/1923 | Christensen | 96/36 |
| 1,709,569 | 4/1929 | Gorsky et al. | 96/36 |
| 3,567,447 | 3/1971 | Chand | 96/36 |
| 3,576,630 | 4/1971 | Yamagawa | 96/36 |
| 3,615,956 | 10/1971 | Irving et al. | 156/17 |
| 3,639,125 | 1/1969 | Chand | 96/35 |
| 3,664,942 | 5/1972 | Havas et al. | 204/192 |
| 3,733,258 | 5/1973 | Hanak et al. | 204/192 E |
| 3,782,940 | 1/1974 | Ohio | 96/35.1 |
| 3,849,135 | 11/1974 | Karlikowski et al. | 96/36 |
| 3,860,783 | 1/1975 | Schmidt et al. | 204/192 E |
| 3,873,361 | 3/1975 | Franco et al. | 204/192 EC |
| 3,960,560 | 6/1976 | Sato | 96/36 |
| 3,966,473 | 6/1976 | Sato | 96/36 |

*Primary Examiner*—Edward C. Kimlin
*Attorney, Agent, or Firm*—Sughrue, Mion, Zinn, Macpeak and Seas

[57] ABSTRACT

A method for forming an image comprising forming a silver, silver halide or binder image in the emulsion layer of a photographic material which comprises a support having a masking layer thereon which carries a silver halide emulsion layer, by exposing and developing the photographic material, heating the photograpic material to thermally decompose the binder of the emulsion layer, selectively removing the thermally decomposed emulsion layer at non-image areas to uncover the masking layer lying thereunder using a binder-removing solution, and then etching away the masking layer at the uncovered areas.

54 Claims, No Drawings

IMAGE FORMING METHOD

BACKGROUND OF THE INVENTION

1. Field of the Invention

The present invention relates to a method for producing an image. More particularly, it relates to a method for producing a heat resistant and durable image having high resolving power and high image contrast.

2. Description of the Prior Art

The optical density of a silver image formed in the emulsion layer of a photographic material which comprises a silver halide emulsion layer coated on a support by exposing and developing the photographic material gradually decreases from its maximum value to a background value at the edge of the silver image. The spacing between the maximum image density portion and the background is usually about one micron. Therefore, it is difficult to obtain a high contrast silver image having closely separated (about one micron) lines or spacings. Silver grains existing between adjacent image lines reduce the image contrast and resolving power.

Moreover, since such an emulsion layer is colored due to thermal decomposition of the binder when heated to about 150° to 200° C., it cannot be used for purposes requiring heat resistance.

One field which requires a heat resistant image is "super-microphotography". An image reduced to 35 mm film size from a 9 by 14 inch (23 by 36 cm) size original with a reduction ratio of about 10 is usually called a "microphotograph," and an image further reduced (to about 2 by 3 mm) by a factor of about 10 is called a "supermicrophotograph." A microphotograph can thus be considered to be an image reduced by a factor of about 10 and a super-microphotograph an image reduced by a factor of about 100.

Since the image size of a super-microphotograph is about 2 by 3 mm or smaller, the enlarging factor is about 100 (10,000 based on area ratio) when a supermicrophotograph is projected on a screen to provide the original image size. Consequently, a light intensity of about 10 million lux is necessary on the image surface of the super-microphotograph if the image projected on a transmission type screen, e.g., with a blackened back surface, is to have a light intensity of about 100 lux when the screen has a transmission optical density of 1. In fact, the super-microphotograph is illuminated with a light intensity of about 12 to 13 million lux to compensate for the loss of the projection lens. The temperature of the emulsion layer of the super-microphotograph increases to several hundred degrees C., due to the heat generated by the light absorbed in the emulsion layer, when it is continuously illuminated with such a strong light. As a result, the binder of the emulsion layer is thermally decomposed and colored to cause the image projected on the screen to be dim and colored. Since the silver image areas absorb light well, the temperature of these areas preferentially increases and the binder of these areas is preferentially decomposed, whereafter the decomposition spreads into the surrounding areas. Decomposition of the binder in even the non-silver image areas proceeds in an accelerated manner once it is slightly colored and light absorption occurs.

Heretofore, emulsion masks and hard surface masks have generally been used as photomasks in microelectronic manufacturing processes. However, an emulsion mask has low edge contrast, as described above, and such low mechanical strength that it is easily damaged, that is, durability is poor. On the other hand, a hard mask is quite durable, but the process for production thereof is complicated. Also, the production of a had mask requires a photoetching process that uses a photoresist which has low sensitivity and requires long exposure times.

Another method for producing a hard surface mask is described in U.S. Pat. No. 3,567,447 which comprises exposing and developing a photographic material which comprises a silver halide emulsion layer coated on a glass support to form a silver image, heating the photographic material to about 400° C., selectively removing the emulsion layer at the non-silver image areas with a gelatin removing solution to uncover the glass support lying thereunder, depositing a metal (e.g., chromium) layer over the entire surface of the photographic material, removing the metal layer at the silver image areas with a metal removing solution, and then removing the emulsion layer at the silver image areas. In this method, the metal layer is deposited on the glass support after a relief image consisting of gelatin binder and silver grains is formed, and, accordingly, procedures for depositing the metal layer are limited (for example, the glass support cannot be treated with a strong acid or alkali to increase adhesion between the metal layer and the glass support since the binder is attacked by a strong acid or alkali). Further, this method is complicated and difficult to practice. Moreover, the abovedescribed metal removing solution may attack the metal layer at non-silver image areas and decrease the durability of the finally obtained metal mask (for example, when aluminum is used as the metal layer and sodium hypochlorite is used to remove the aluminum layer at the silver image areas, not only the aluminum layer at the silver image areas but also the aluminum layer at the non-silver image areas is removed, since sodium hypochlorite is an etchant for aluminum). Furthermore, the smoothness of the edges of a photomask obtained by this method is poor.

SUMMARY OF THE INVENTION

It is, therefore, one object of the present invention to provide a method for producing a heat resistant, durable image having high resolving power and good edge smoothness.

Another object of the present invention is to provide a method for easily producing a durable photomask having high resolving power and good edge smoothness using a photographic material having high sensitivity.

A further object of the present invention is to provide a method for producing a durable photomask having a masking layer strongly adhesive to a support.

The above-described objects of the present invention can be attained by a method comprising:

(a) forming a silver, silver halide or binder image in the emulsion layer of a photographic material which comprises a support having a masking layer thereon, the masking layer having thereon a silver halide emulsion layer, either directly or on a subbing layer on the masking layer, by exposing and developing the photographic material;

(b) heating the photographic material to thermally decompose the biner of the emulsion layer;

(c) selectively removing the thermally decomposed emulsion layer at the non-image areas to uncover the masking layer lying thereunder using a binder-removing solution; and (d) then etching away the masking layer at the uncovered areas.

It has been discovered that the emulsion layer remaining at the image areas formed in step (c) above is not penetrated by the etching solution for the masking layer and is not swollen by the etching solution for the masking layer.

DETAILED DESCRIPTION OF THE INVENTION

The photographic material used for the present invention fundamentally comprises a transparent support having thereon a masking layer and a silver halide emulsion layer. If necessary, at least one subbing layer can be interposed between the masking layer and the silver halide emulsion layer. The photographic material used for the present invention is different from conventional silver halide photographic material in that it possesses a masking layer.

The term "transparent support" as is used herein designates a support which comprises a substance capable of transmitting not less than about 50%, preferably not less than 70%, of electromagnetic waves in the near ultraviolet (e.g., about 2900 Å to about 4000 Å) and visible light regions (e.g., about 4000 Å to about 7500 Å).

Examples of transparent supports are glass (e.g., silica glass, soda lime glass, potash glass, barium glass, borosilicate glass, etc.), silica, sapphire, transparent ceramics, heat resistant high melting point polymers such as poly (pyromellitic acid-p-phenylenediamine), poly(p-oxybenzoate), poly(ethylene-2,6-naphthalate), polyamidoimine polymers as described in U.S. Pat. No. 3,554,984, polyimidoimine polymers as described in U.S. Pat. No. 3,472,815, etc., and the like.

The masking layer is provided by depositing a masking material on a support using vacuum deposition, sputtering, ion plating, chemical plating or the like. Suitable masking materials are metal oxides such as silicon oxide, chromium oxide, ferric oxide, magnetic iron oxide (iron(II)-iron(III) oxide), cuprous oxide, cupric oxide, nickel oxide, cobalt oxide, germanium oxide, cadmium oxide, titanium oxide, tantalum oxide, etc., metals such as chromium, aluminum, silver, titanium, cobalt, tungsten, nickel, tellurium, gold, platinum, iridium, palladium, rodium, molybdenum, tantalum, a nickel-iron alloy, a nickel-chromium-iron alloy, a chromium-iron alloy, a chromium-aluminum alloy, a nickel-chromium alloy, a nickel-cobalt alloy, a cobalt-iron alloy, a silicon- gold alloy, a titanium-aluminum alloy, a copper-beryllium alloy, etc., semi-metals such as silicon, germanium, etc., chalcogen glasses such as As-S-Ge, As-Se-Ge, Ge-S, etc., and mixtures or combinations thereof such as chromium oxide on chromium, cobalt oxide on cobalt, silicon oxide on silicon, germanium-silicon, etc.

The masking material provides a masking effect to ultraviolet and/or visible light.

The thickness of the masking layer cannot be set forth unequivocally since the thickness varies depending upon the end-use thereof. However, in general, a thickness ranging from about 0.01 to about 10$\mu$, preferably 0.05 l to 1.5$\mu$, is employed. If the thickness is too small, absorption of light is too small, while if the thickness is too large, etching takes too long and side-etching occurs, which is not desirable. Since a metal or metal oxide possesses much greater mechanical strength than a photographic emulsion layer or the like, the masking layer renders the image scratch resistant.

The subbing layer optionally used in the present invention is a layer which intimately adheres to both the masking layer and the silver halide emulsion layer. When the masking layer differs substantially in properties from the silver halide emulsion layer, two or more subbing layers can be employed which adhere well to the layer which they are closest to, and, of course, to each other. Suitable subbing layers are gelatin, gelatin derivatives as later described for the water soluble binder, albumin, casein, cellulose derivatives as later described for the water soluble binder, starch derivatives, sodium alginate, polyvinyl alcohol, poly-N-vinyl pyrrolidone, polyacrylic acid copolymers, polyacrylamide, alcohol-soluble polyamide resins as described in Japanese Patent Publication 5509/64, a mixture of a cellulose ester and a polyester of terephthalic acid-glycols as described in Japanese Patent Publication 14503/68, a mixture of gelatin and nitrocellulose as described in Japanese Patent Publication 2597/69, compounds as described in Japanese Patent Publication 11616/71, homopolymers or copolymers of glycidyl (meth) acrylates as described in West German Patent OLS 2,001,727, etc. Also, a subbing layer formed by providing a thin polyvinyl acetate layer (for example, at a thickness of about 0.1 to about 0.3$\mu$) and bringing the surface into contact with an aqueous alkaline solution such as an aqueous solution of sodium hydroxide for saponification can be used. A suitable thickness for the subbing layer ranges from about 0.1 to about 0.5$\mu$.

The silver halide emulsion layer coated on the masking layer or subbing layer, as the case may be, can be obtained by dispersing one or more silver halides in a water-soluble binder. The silver halide(s) used is not limited. Illustrative silver halides are silver chloride, silver bromide, silver iodide, silver chlorobromide, silver bromoiodide, silver chloroiodide, silver chlorobromoiodide, mixtures thereof, etc. While any silver halide emulsion can be used, emulsions having silver halide grains smaller than about 0.1$\mu$ are preferred to obtain higher resolving power. The grain size of the emulsion is not limited to such sizes, as they are merely preferred. The weight ratio of silver halide to the water soluble binder (dry weight; hereafter the same) is preferably about 1:6 to about 8:1, though this is not limitative.

A most typical silver halide emulsion is an emulsion which contains about 90 mol% or more silver bromide (preferably containing not more than about 5 mol% silver iodide) which comprises silver halide grains of a mean grain size of not more than about 0.1$\mu$ (a so-called Lippmann emulsion), in which the weight ratio of silver halide to the water-soluble binder is about 1:4 to about 8:1. Another example of a typical silver halide emulsion is an emulsion which contains about 90 mol% or more silver bromide (preferably containing not more than about 5 mol% silver iodide) and which comprises silver halide grains of a mean grain size of not more than about 1$\mu$, in which the weight ratio of silver haliide to the water soluble binder is about 1:6 to about 6:1. Still another example of a silver halide emulsion is an emulsion which contains about 50 mol% or more (preferably 70 mol% or more) silver chloride and which comprises silver halide grains of a mean grain size of not more than about 1$\mu$, in which the weight ratio of silver halide to the water soluble binder is about 1:6 to about 6:1.

On the other hand, examples of water soluble binders include gelatin, colloidal albumin, casein, cellulose derivatives (e.g., carboxymethyl cellulose, hydroxyethyl cellulose, etc.), saccharide derivatives (e.g., agar-agar, sodium alginate, starch derivatives, etc.), synthetic hydrophilic colloids (e.g., polyvinyl alcohol, poly-N-vinyl pyrrolidone, polyacrylic acid copolymers, polyacrylamide, derivatives thereof, etc.). If desired, a compatible mixture of two or more of these binders can be used. Of these, a most preferred binder is gelatin which can be replaced, partly or completely, by a synthetic high molecular weight substance, by a gelatin derivative (prepared by processing gelatin with a compound having a group capable of reacting with the functional groups contained in the gelatin molecule (i.e., amino groups, imino groups, hydroxy groups or carboxy groups), or by a graft polymer prepared by grafting a molecular chain of some other high molecular weight substance onto the gelatin. Suitable compounds for preparing gelatin derivatives are isocyanates, acid chlorides and acid anhydrides as described in U.S. Pat. No. 2,614,928, acid anhydrides as described in U.S. Pat. No. 3,118,766, bromoacetic acids as described in Japanese Patent Publication 5514/64, phenyl glycidyl ethers as described in Japanese Patent Publication 21845/67, vinyl sulfone compounds as described in U.S. Pat. No. 3,132,945, N-arylvinylsulfoneamides as described in British Pat. No. 861,414, maleinimide compounds as described in U.S. Pat. No. 3,186,846, acrylonitriles as described in U.S. Pat. No. 2,594,293, polyalkylene oxides as described in U.S. Pat. No. 3,312,553, epoxy compounds as described in Japanese Patent Publication 26845/67, acid esters as described in U.S. Pat. No. 2,763,639, alkanesulfones as described in British Patent 1,033,189, etc. Descriptions of suitable branched high molecular weight polymers to be grafted on gelatin are given in U.S. Pat. Nos. 2,763,625; 2,831,767; and 2,956,884; Polymer Letters, 5, 595 (1967), Phot. Sci. Eng., 9, 148 (1965), *J. Polymer Sci.* A-1 9, 3199 (1971), and the like. Homopolymers or copolymers of compounds which are generally called vinyl monomers, such as acrylic acid, methacrylic acid, the ester, amide, and nitrile derivatives thereof, styrene, etc., are widely used for grafting to gelatin.

Hydrophilic vinyl polymers having some compatibility with gelatin, such as homopolymers or copolymers of acrylic acid, acrylamide, methacrylamide, hydroxyalkyl acrylates, hydroxyalkylmethacrylates, etc., are particularly preferred.

The silver halide emulsion is advantageously optically sensitized with one or more known optical sensitizers such as the cyanine dyes and merocyanine dyes as described in U.S. Pat. Nos. 1,346,301; 1,846,302; 1,942,854; 1,990,507; 2,493,747; 2,739,964; 2,493,748; 2,503,776; 2,519,001; 2,666,761; 2,734,900; and 2,739,149; and British Pat. No. 450,058.

The silver halide emulsion can be exposed with electromagnetic radiation to which the silver halide emulsion is sensitive, e.g., visible, ultraviolet, electron beam, X-ray radiation, etc. With optically sensitized photographic light-sensitive materials, it is convenient to select radiation mainly having a wavelength corresponding to the optically sensitized region of the emulsion as the light for exposing the emulsion layer.

The emulsion is advantageously chemically sensitized with salts of noble metals such as ruthenium, rhodium, palladium, iridium, platinum, etc., as described in U.S. Pat. Nos. 2,448,060; 2,540,086; 2,566,245; 2,566,263; and 2,598,079, gold salts such as chloroauric acid, gold (III) chloride, etc., as described in U.S. Pat. Nos. 2,399,083; 2,540,085; 2,597,856; and 2,597,915, sulfur compounds which can form silver sulfide by reacting with a silver salt as described in U.S. Pat. Nos. 1,574,944; 2,410,689; and 3,501,313, stannous salts, amines and other reducing substances as described in U.S. Pat. Nos. 2,487,850; 2,518,698; 2,521,925; 2,521,926; 2,694,637; 2,983,610; and 3,201,254, etc.

The silver halide emulsion can contain compounds to prevent desensitization and fogging during manufacturing, storing or processing of the photographic light-sensitive material. Examples of these compounds are heterocyclic compounds such as 4-hydroxy-6-methyl-1,3,3a,7-tetrazaindene, 3-methylbenzothiazole, 1-phenyl-5-mercaptotetrazole, etc., mercury containing compounds, mercapto compounds or metal salts. Descriptions of such compounds are given in C. E. K. Moes, The Theory of The Photographic Process, 3rd Edition, pp. 344-349 (1966), U.S. Pat. Nos. 1,758,576 (mercaptothiazoles), 2,110,178 (glutathione), 2,131,038 (salts of benzothiazoliums), 2,694,716 (salts of benzothiazoliums), 3,326,681 (salts of benzoselenazoliums), 2,173,628 (aminohydroxypyrimidines), 2,304,962 (mercaptopyrimidines), 2,697,040 (mercaptotetrazoles and 1-phenyl-5-tetrazoline-5-thions), 2,324,123 (aminonitrobenzimidazole, nitroimidazoles and aminoimidazoles, 2,394,198 (salts of benzenesulfines), 2,444,605 through 2,444,608 (hydroxy-tetrazaindenes, aminotetrazaindenes and pentazaindenes); British Pat. No. 893,428 (mercaptotetrazaindenes); U.S. Pat. Nos. 2,566,245 (salts and complexes of noble metals such as platinum, iridium, etc.), 2,697,099 (mercaptothiazoles and benzothiazoline-2-ones), 2,708,162 (urazoles, parabanic acid and hydantoins), 2,728,663, 2,728,667 and 2,732,302 molecular compounds of mercuric halides and nitrogen containing heterocyclic compounds or Hg salts), 2,476,536 (mercaptotriazines), 2,824,001 (mercaptothiazoles), 2,843,491 (mercaptooxadiazoles), 3,052,544 (poly-N-vinyl-2-pyrrolidones), 3,137,577 (organic mercury compounds such as 8-(3-hydroxymercuro-2-methoxypropyl)-2-oxo-2H-1-benzopyran-3-carboxylic acid, etc.), 3,220,839 (isothiourea derivatives and isothiouronium salt derivatives), 3,226,231 (mercaptobenzoic acids), 3,236,652 (sulfocatechols and dihydroxynaphthalenesulfonic acids), 3,251,691 (mercaptoimidazoles, benzimidazoles and nitrobenzimidazoles), and 3,252,799 (2-mercaptoimidazoles); British Pat. No. 403,789 (mercaptoimidazoles); U.S. Pat. No. 3,287,135 (urazoles), 3,420,668 (sulfonamides having a N-Hg bond (e.g., (N-phenyl-p-toluenesulfonamido) ethyl mercury)), 3,622,339 (polycondensation products of s-triazines), 2,933,388 (4-mercapto-1,3,3a,7-tetrazainedenes), 3,567,454 (mercury (II) salts of sulfo- or sulfonato substituted organic thiols), and 3,595,662 (chelate compounds of polyaminopolycarboxylic acids and mercury (II)), etc.

The emulsion can also contain light-absorbing dyes as described in U.S. Pat. Nos. 2,527,583, 2,611,696, 3,247,127, and 3,260,601, etc.

The emulsion is advantageously hardened with a suitable hardening agent for hydrophilic colloids, such as formaldehyde or a like hardener; halogen-substituted fatty acids (e.g., mucochloric acid, mucobromic acid, etc.); compounds having a plurality of acid anhydride groups; methanesulfonic acid bisester; dialdehydes or the sodium bisulfate adducts thereof such as β-methylglutaraldehyde bissodium bisulfite; bisaziridinecarboxyamides (eg., trimethylenebis(1-aziridinecarboxyamide)); triazine derivatives (e.g., 2-hydroxy-4,6-dichloro-S-triazine, etc.); and the like.

The silver halide emulsion can contain one or more surface active agents. These surface active agents are generally used as coating aids, however, they can also sometimes be used for other purposes such as dispersion by emulsifying, sensitization, improvement of photographic characteristics, antistatic effects, anti-adhesion effects, etc.

Useful surface active agents include natural surface active agents such as saponin, etc.; nonionic surface active agents such as alkylene oxides, glycerin compounds, glycidols, etc.; cationic surface active agents such as higher alkylamides, quaternary ammonium salts, heterocyclic compounds (e.g., pyridine, etc.), phosphonium or sulfonium salts, etc., anionic surface active agents having acidic groups such as a carboxylic acid group, a sulfonic acid group, a phosphoric acid group, a sulfuric ester group, a phosphoric ester group, etc.; amphoteric surface active agents such as amino acids, aminosulfonic acids, sulfuric or phosphoric esters of amino-alcohols, etc.

Examples of these surface active agents are described in U.S. Pat. Nos. 2,271,623, 2,240,472, 2,288,226, 2,739,891, 3,068,101, 3,158,484, 3,201,253, 3,210,191, 3,294,540, 3,415,649, 3,441,413, 3,442,654, 3,475,174, 3,545,974, 3,666,478, and 3,507,660; British Pat. No. 1,198,450; Ryohei Oda, et al, *Kaimen Kasseizai no Gosei to sono Oyo* (*Synthesis and Application of Surface Active Agents*), Maki-Shoten (1964); A. W. Perry, Surface Active Agents, Interscience Publication Incorporated (1958); J. P. Sisley *Encyclopaedia of Surface Active Agents*, Vol. 2, Chemical Publishing Company (1964); etc.

The silver halide emulsion can be coated on a masking layer as it is or after adding a coating aid thereto. The silver halide emulsion layer preferably has a dry thickness of about 0.3 to about 10μ and can be coated in one or more layers on the masking layer. When two layers of the silver halide emulsion are used on the masking layer, the total thickness is less than about 10μ.

If desired, a backing layer, an antihalation layer, an interlayer, an uppermost layer (e.g., a protective layer, etc.), and the like can be provided on the support, masking layer or on the emulsion layer.

The formation of a silver image in the silver halide emulsion layer can be effected using conventional photographic processings, that is, by development processing the exposed emulsion layer and, if necessary, fixing. Conventional photographic processings including exposure, development, fixing, etc., which can be used are described in detail in "Techniques of Microphotography" Kodak Data Book p-52, Eastman Kodak Co., Rochester, N.Y.

Developing agents, which can be used in the method of the present invention for forming silver images, are those well known in the art, and include developing agents such as the dihydroxybenzenes (e.g., hydroquinone, 2-chlorohydroquinone, 2-bromohydroquinone, 2-isopropylhydroquinone, toluhydroquinone, 2-phenylhydroquinone, 2,3-dichlorohydroquinone, 2,5-dimethylhydroquinone, pyrogallol, etc.), the 3-pyrazolidones (e.g., 1-phenyl-3-pyrazolidone, 1-phenyl-4-methyl-3-pyrazolidone, 1-phenyl-4,4-dimethyl-3-pyrazolidone, 1-phenyl-4-ethyl-3-pyrazolidone, 1-phenyl-5-methyl-3-pyrazolidone, etc.) the aminophenols (e.g., o-aminophenol, p-aminophenol, o-(methylamino)-phenol, p-(methylamino)phenol, p-(diethylamino)phenol, 2,4-diaminophenol, p-(benzylamino)phenol, etc.), ascorbic acid, the 1-aryl-3-aminopyrazolines (e.g., 1-(p-hydroxyphenyl)-3-aminopyrazoline, 1-(p-methylaminophenyl)-3-pyrazoline, 1-(p-aminophenyl)-3-pyrazoline, 1-(p-amino-m-methylphenyl)-3-aminopyrazoline, etc.), N-(p-hydroxyphenyl)glycine, the compounds described as developing agents in C. E. K. Mees & T. H. James, *The Theory of Photographic Processes*, 3rd Edition, chapter 13, Macmillan Co., New York (1966), L. F. A. Mason, Photographic Processing Chemistry, pp 16–30, The Focal Press, London (1966), and mixtures thereof. The developer generally possesses a pH of not less than about 8, preferably about 8.5 to about 12.5.

The developer can contain, if desired, an alkali agent (e.g., a hydroxide of an alkali metal or ammonium, carbonate, borate, etc.), a pH adjusting agent or buffer (e.g., a weak acid or alkali such as acetic acid, boric acid, a salt thereof, etc.), a development promoting agent (e.g., pyridinium compounds and cationic compounds as described in U.S. Pat. Nos. 2,648,604 and 3,671,247, potassium nitrate, sodium nitrate, condensation products of polyethylene glycol and derivatives thereof as described in U.S. Pat. Nos. 2,533,990, 2,577,127, and 2,950,970, nonionic compounds such as polythioethers represented by compounds as described in British Pat. Nos. 1,020,033 and 1,020,032, pyridine, organic amines such as ethanolamine, benzyl alcohol, hydrazines, etc.), an antifogging agent (e.g., an alkali bromide, an alkali iodide or nitrobenzimidazoles as described in U.S. Pat. Nos. 2,496,940 and 2,656,271, mercaptobenzimidazole, 5-methylbenzotriazole and 1-phenyl-5-mercaptotetrazole), compounds for a rapid developing solution as described in U.S. Pat. Nos. 3,113,864; 3,342,596; 3,295,976; 3,615,522 and 3,597,199, thiosulfonyl compounds as described in British Pat. No. 972,211, phenazine-N-oxides as described in Japanese patent publication No. 41675/71, antifogging agents as described in *Kagaku Shashin Binran* (handbook of Scientific Photography), Vol. 2, pp. 29–47, Maruzen, Tokyo (1959), etc.), stain or sludge preventing agents as described in U.S. Pat. Nos. 3,161,513 and 3,161,514, British Pat. Nos. 1,030,442; 1,144,481 and 1,251,558, a preservative (e.g., a sulfite, an acid sulfite, hydroxylamine hydrochloride, formaldehyde sulfite adduct, ethanolamine sulfite adduct, etc.), a surface active agent, etc.

On the other hand, suitable fixing agents for the silver halide are the generally well known solvents for silver halides, such as a water-soluble thiosulfate (e.g., potassium thiosulfate, sodium thiosulfate, ammonium thiosulfate, etc.), a water-soluble thiocyanate (e.g., potassium thiocyanate, sodium thiocyanate, ammonium thiocyanate, etc.), a water-soluble organic diol (e.g., 3-thia-1,5-pentanediol, 3,6-dithia-1,8-octanediol, 3,6,9-trithia-1,11-undecanediol, 3,6,9,12-tetrathia-1,14-tetradecanediol, etc.), a water-soluble sulfur-containing organic dibasic acid (e.g., ethylenebisthioglycolic acid, etc.) and water-soluble salts thereof (e.g., potassium ethylenebisthioglycolate, etc.), and mixtures thereof.

The fixing solution can contain, if desired, a preservative (e.g., a sulfite, a bisulfite, etc.), a pH buffer (e.g., boric acid, a borate, etc.), a pH adjusting agent (e.g., acetic acid, etc.), a chelating agent, and the like.

A silver image is formed in the exposed areas, and, in the unexposed areas, silver halide is removed by fixing while the binder in the silver halide emulsion layer in unexposed areas remains intact. Where the silver halide emulsion is a reversal type emulsion or where reversal processing is conducted, the binder layer remains in exposed areas, whereas a silver image is formed in the unexposed areas.

In the present invention, the term "non-silver image areas" (non-image areas) designates areas other than silver image areas or silver halide image areas (image areas). The terms "silver image areas" or "silver halide image areas" and "non-silver image areas" or "non-silver halide image areas" do not necessarily mean light exposed areas and light unexposed areas, respectively. Image areas and non-image areas do not necessarily designate images or non-images formed by silver or silver halide as in some cases they mean image areas or non-image areas formed by a binder.

A silver halide image can be formed by a conventional reversal development. For example, a silver halide emulsion can be exposed and developed, and then bleached with an aqueous solution containing potassium dichromate and sulfuric acid. Also, a silver halide image can be formed by converting a silver image to a silver halide image. For example, a silver image can be bleached with an aqueous solution containing potassium dichromate and hydrochloric acid to convert silver into silver halide.

A binder image can be formed, for example, by bleaching a silver image with an aqueous solution containing potassium dichromate and sulfuric acid. Also, a binder image can be formed by bleaching a silver image with an aqueous solution containing potassium dichromate and hydrochloric acid and then removing the silver halide formed by bleaching with a fixing solution.

The photographic material in which a silver, silver halide or binder image is formed is then heated to a high temperature (hereinafter this heating process is designated "baking").

Baking can be conducted in any atmosphere or in a vacuum so long as photographic properties are not harmed, e.g., in air, vacuum or any other gas such as argon, nitrogen, oxygen, hydrocarbons (e.g., methane, propane, etc.), halogenated hydrocarbons (e.g., Freon, etc.), etc., at a temperature above about 250° C., preferably at 300° to about 600° C. If the baking temperature is lower than about 250° C., baking takes a long time, while if the temperature is higher than about 600° C., the support might be deformed, and, further, the silver, silver halide image or binder image might be damaged. By baking, the binder of the emulsion layer is thermally decomposed and becomes non-swellable with, unsoftenable with, chemically inert to and impermeable to an etching solution, that is, the binder becomes resistant to an etching solution. Further, as will be described later, the thermally decomposed binder becomes selectively removable with a binder removing solution at the non-image areas.

The binder of the emulsion layer forming a binder image is also thermally decomposed in both the binder image areas and the non-image areas by baking. The thermally decomposed binder at the non-image areas is, however, selectively removable with a binder removing solution because the dissolution rate of the binder at the non-image areas in the binder removing solution is extremely high in comparison with that of binder image areas. The reasons therefor are unknown, but it could be effected by bleaching the emulsion to harden the binder at the binder image areas.

The baking time is the time to decompose the binder and to give the binder resistance to an etching solution, and further to give the thermally decomposed binder the capability of being selectively removed at the image areas as described above, and depends on the baking temperature. The preferred range for the baking time is about 1 to about 120 min., most preferably 2 to 30 min. For instance, when the binder mainly comprises an alkali treated gelatin at a thickness of $2\mu$, a baking time of about 10 to 30 min. is sufficient at 350° C. and about 4 to 15 min. at 400° C.

After baking, the photographic material is then treated with a binder removing solution to selectively remove the thermally decomposed binder at the non-image areas. The binder removing solution is generally an aqueous solution (about 0.1 to about 20 wt%) of a generally known bleaching agent such as sodium hypochlorite, potassium hypochlorite, sodium hypobromite, potassium hypobromite, sodium chlorite, potassium chlorite, sodium chlorate, potassium chlorate, sodium bromate, potassium bromate, etc. Suitable temperatures for binder removal range from about 15° to about 60° C. The binder removal time depends on the concentration, temperature and type of binder removing solution and cannot be set forth unequivocably. However, in general, a removal time ranging from about 10 sec. to about 30 min. is employed. When the baking time is too short or the baking temperature is too low and while the removal time becomes short, the binder at the image areas becomes easily removable and such is not desirable.

It is described in U.S. Pat. No. 3,567,447 that binder at non-silver image areas can be selectively removed with a gelatin removing solution after a baking process; however, the mechanism is unknown. It should been noted that in accordance with this reference, a photomask is obtained by providing a chromium layer as a masking layer on the entire surface of a photographic material after removing binder at non-silver image areas and selectively etching away the masking layer on image areas, and then removing a thermally decomposed emulsion layer lying thereunder. Accordingly, the present invention is readily distinguished from this reference.

The selective removal process of the emulsion layer is completed when the binder at the non-image areas is removed with the binder removing solution and the masking layer lying thereunder is uncovered. The uncovered masking layer is then etched away.

The uncovered masking layer at the non-image areas can be removed by any conventional technique such as chemical etching, plasma etching, ion etching, etc. It has been found that the emulsion layer remaining at the image areas acts as a resist for chemical etching, plasma etching, ion etching, etc. Plasma etching, ion etching, etc., of the masking layer is successfully conducted if the emulsion layer at the image areas still remains or just disappears when the masking layer is just removed by plasma etching, ion etching, etc., whereas the etching is unsuccessful if the emulsion layer at the image areas is completely removed and the masking layer has not been completely removed by the etching. Therefore, a necessary requirement for the resist (the emulsion layer at the image areas) is that it must have a low etching rate.

In the present invention the thickness of the resist layer (emulsion layer at image areas) is generally much larger than that of the masking layer; therefore, it is not always necessary that the etching rate of the resist layer be smaller than that of the masking layer. For instance, when a chromium layer at a thickness of $0.1\mu$ is used as a masking layer and an emulsion layer at the image areas at a thickness of $3\mu$ is used as a resist, the etching rate of the resist layer can be about 20 times that of the masking layer. When removal of the masking layer is effected by chemical etching, plasma etching, ion etching, etc., an intensification and/or toning treatment which will be described later is particularly important.

Chemical etching as is used in this invention includes etching with an etching solution. Etching is effected using methods as are conventionally employed for metals, metal oxides, etc., which comprise the masking layer. Suitable etching solutions which can be used for chromium and chromium oxide ($Cr_2O_3$) include an aqueous solution of cerium ammonium nitrate (at a concentration of about 80 to about 250 g/liter) and about 60 to about 70% perchloric acid (in an amount of about 20 to about 80 ml/liter) with an etching time of about 15 sec. to about 10 min. at a temperature of about 15° to about 40° C., or an aqueous solution of cerium-(IV) sulfate (at a concentration of about 40 to about 200 g/liter) and 98 wt% sulfuric acid (in an amount of about 20 to about 100 ml/liter) with an etching time of about 20 sec. to about 10 min. at a temperature of about 15° to about 40° C., etc.; suitable etching solutions for iron oxide include an aqueous solution of hydrochloric acid (at a concentration of about 1 to about 12 N) with an etching time of about 10 sec. to about 4 min. at a temperature of about 30° to about 60° C., etc; suitable etching solutions for silicon oxides include hydrofluoric acid in an aqueous solution (at a concentration of about 6 to about 48 wt%) with an etching time of about 10 sec. to about 1 min. at a temperature of about 15° to about 40° C., a mixture of about 0.5 to about 2 parts by volume of hydrofluoric acid (48 wt% aqueous solution) and about 6 to about 24 parts by volume of ammonium fluoride (40 wt% aqueous solution) with an etching time of about 30 sec. to about 5 min. at a temperature of about 15° to about 40° C., etc.; suitable etching solutions for nickel include an aqueous solution of ferric chloride (at a concentration of about 5 to about 300 g/liter) with an etching time of about 1 to about 5 min. at a temperature of about 15° to about 40° C., etc.

Plasma etching as is used in this invention includes etching with a gas plasma. Plasma etching depends upon the plasma conditions (frequency, power, gas and gas pressure). Methods and devices for plasma etching are described, for example, in Richard L. Bersin "Automatic Plasma Machines for Stripping Photoresist", Solid State Technology, June, 1970, 13(6), pp 39–45; Stephan M. Irving, "A Plasma Oxidation Processes for Removing Photoresist Films" Solid State Technology, June, 1971, 14(6), pp. 47–51; U.S. Pat. 3,615,956; etc.

Generally used conditions for plasma etching are set out below. Suitable temperatures which can be used range from about room temperature (e.g., about 15° to about 30° C.) to about 600° C.

The plasma etching can be conducted in any gas. However, gases which remove the emulsion layer at the image areas slowly and remove the masking layer quickly are desired. For instance, when a chromium layer is used as a masking layer, carbon tetrachloride and a mixture of carbon tetrachloride and air are very suitable, and when a silicon oxide layer is used as a masking layer, carbon tetrafluoride, Freon (trade name, e.g., $CHClF_2$, $CCl_2F_2$ and $CCl_2F-CClF_2$, etc.), a mixture of carbon tetrafluoride and air, and a mixture of Freon and air, etc., are very suitable. Air, helium, argon, nitrogen, oxygen, etc., can also be used.

Suitable gas pressures for plasma etching range from about $10^{-3}$ to about 5 Torr.

Methods and devices for ion etching are described, for example, in R. G. Wilson & G. R. Brewer, *ION BEAMS with Application to Ion Implantation*, pp. 317–335, John Wiley & Sons (1973) and L. I. Maissel & R. Glang, *Handbook of Thin Film Technology*, pp. 7-4-9-7-53, McGraw-Hill (1971). One example of ion etching is cathode sputtering. Other examples of ion etching are etching by RF discharge and by glow discharge.

There is no limitation on the gases for ion etching. Example of suitable gases include air, oxygen, argon, nitrogen, carbon tetrachloride, carbon tetrafluoride, Freon (e.g., $CCl_2F_2$, $CHClF_2$, $CCl_2F-ClF_2$, etc.), etc.

Suitable gas pressures for ion etching ranges from about $10^{-4}$ to about $10^{-1}$ Torr.

After the uncovered masking layer is etched away, the emulsion layer at the image areas can be removed, if desired. The removal of emulsion layer can be effected using an alkali (e.g., an aqueous solution of sodium hydroxide or potassium hydroxide at a concentration of about 10 to about 40% by weight at about 40° to about 60° C. for about 10 to about 20 minutes, etc.), an acid (e.g., sulfuric acid (about 40 to 98 wt%) at about 40° to about 90° C. for about 10 to about 20 minutes, or nitric acid (about 30 to about 70 wt%) at about 40° to about 95° C. for about 10 to about 20 minutes, etc.) or a salt (e.g., an aqueous solution of sodium hypochlorite (about 4 to about 10 wt%) at about 20° to about 60° C. for about 10 to about 20 minutes, or potassium hypochlorite (about 5 to about 10 wt%) at about 40° to about 60° C. for about 10 to about 20 minutes, etc.).

The silver or silver halide image can be intensified and/or toned using known methods before baking. By intensification and/or toning (hereafter often simply designated intensification), the silver image is converted to another material or other materials are added to the silver image. As a result, it has been found that the thickness and width of the emulsion layer at the image areas become larger than before intensification and the emulsion layer at the image areas becomes more resistant to the binding removing solution, i.e., the width of the image lines does not unnecessarily decrease during processings. Further, during the aforementioned plasma etching, ion etching or chemical etching of the masking layer, a resist image strengthened by intensification is more resistant to plasma etching, ion etching or chemical etching, and, therefore, the phenomenon of narrowing of image lines occurs only with difficulty.

General methods for toning (or intensification) are described in Pierre Glafkides, Photographic Chemistry Vol. 1, pp. 189–199 and Vol. 2, pp. 643–662, Fountain Press, London (1958). Suitable examples are dichromate intensification, mercury intensification, copper intensification, lead intensification, uranium toning, selenium toning, sulfur toning, iron toning, nickel toning, cobalt toning, copper toning, vanadium toning, titanium toning, lead chromate toning, cadmium toning, noble metal toning, etc. Of these, vanadium toning, titanium toning, iron toning, nickel toning, cobalt toning, rhodium toning, palladium toning, gold toning, lead chromate toning and dichromate intensification are most preferred, since the rate of plasma etching or ion etching of an image toned by these methods is very small.

As a special case of intensification, the silver image can be bleached with a bleached solution containing dichromate ions to harden the binder at the image areas. As a result, the emulsion layer at the image areas is not completely removed by plasma etching or ion etching before the masking layer at the uncovered areas is completely removed.

The method of the present invention has the following various advantages. When the emulsion layer at the image areas is not removed, the emulsion layer at the image areas mechanically protects the masking layer lying thereunder, and, therefore, the masking image is not easily scratched. Further, minute pin holes existing in the masking layer are covered with the silver or silver halide image areas of the emulsion layer. In the present invention the transmission optical density of the silver or silver halide image before baking is much smaller than that of a conventional emulsion mask since the thickness of the emulsion layer of the present invention is, in general, about one tenth to about a half of that of a conventional emulsion mask, however, the binder of the emulsion layer is thermally decomposed and colored by baking, and, accordingly, the transmission optical density of the silver, or silver halide image after baking becomes sufficiently large (e.g., 1.5 to 3.0 or more). Therefore, the emulsion layer remaining on the masking layer can optically mask the pin holes. Even if scratches or pin holes occur in the emulsion layer, no scratches or pin holes appear in the image areas of the mask since the masking layer exists under the scratches or pin holes in the emulsion layer. Since the probability that pin holes in the masking layer and pin holes in the emulsion layer will coincide is very small, substantially no pin holes exist in the image areas of the mask.

Furthermore, since the silver image is nearly black and has low light reflection, it can decrease the surface reflection of the masking layer. The silver image before baking or the silver image after baking but before etching of the masking layer can be used as a reflection image. That is, since a glossy masking layer is seen at non-silver image areas, sufficient optical contrast is present between the silver image areas and the light reflective masking layer at the non-silver image areas, and, accordingly, the silver image can be used for purposes requiring reflection patterns such as in a reflection encoder.

It has unexpectedly been found that when a chromium layer having an emulsion layer thereon is baked, the chromium layer becomes highly scratch resistant. That is, a chromium layer could be scratched with an iron marker before baking, whereas it could not be scratched with the same iron marker at the same conditions after baking. The mechanism of this effect is unknown; however, this phenomenon helps the above-described effect where minute pin holes existing in the masking layer are covered with the silver or silver halide image areas of the emulsion layer.

The following examples are given to illustrate the invention in greater detail. Unless otherwise indicated, all parts, percents, ratios and the like are by weight.

EXAMPLE 1

1400 ml of a silver bromide emulsion (mean grain size of silver bromide: about 0.06μ) was prepared using 50 g of gelatin and 188 g of silver bromide in a conventional manner. This emulsion was subjected to physical ripening in a conventional manner and then subjected to chemical ripening in a conventional manner using sodium thiosulfate and chloroauric acid. To this emulsion was added 0.15 g of 5-[2-(3-methylthiazolinilidene)-ethylidene]-3-carboxymethylrhodanine to optically sensitize the emulsion to light of a wavelength of 510 nm to 560 nm. Then, the emulsion was coated to obtain a dry thickness of about 2μ on a chromium layer (thickness of 0.1μ) which had been vacuum deposited on a soda lime glass plate, and then dried to obtain a photographic light-sensitive material. This photographic light-sensitive material was image-wise exposed [exposed to light from a tungsten lamp through a green filter (Kodak Wratten No. 58B) for 3 sec. The light intensity on the green filter was about 1000 lux (intensity of light just before reaching the green filter) and the distance between the green filter and the photographic light-sensitive material was about 20 cm] and developed in a developer having the following composition (24° C., 5 min), followed by fixing in a fixing solution having the following composition (24° C., 1 min.) to obtain a silver image.

| Developer | |
|---|---|
| 1-Phenyl-3-pyrazolidone | 0.5 g |
| Sodium Sulfite (anhydrous) | 50 g |
| Hydroquinone | 12 g |
| Sodium Carbonate (monohydride) | 60 g |
| Potassium Bromide | 2 g |
| Benzotriazole | 0.2 g |
| 1-Phenyl-5-mercaptotetrazole | 5 mg |
| Phenazine-2-carboxylic Acid | 1 g |
| Water to make | 1 liter |
| Fixing Solution | |
| 70% Aqueous Ammonium Thiosulfate Solution | 200 ml |
| Sodium Sulfite (anhydrous) | 15 g |
| Boric Acid | 8 g |
| Glacial Acetic Acid | 16 ml |
| Aluminum Sulfate | 10 g |
| Sulfuric Acid (98%) | 2 ml |
| Water to make | 1 liter |

After rinsing in water and drying, the photographic material was heated at 400° C. in air for 10 min. After natural cooling to room temperature (about 24° C.), the photographic material was immersed in a 5 wt% sodium hypochlorite aqueous solution at 20° C. for 8 min. The thermally decomposed binder at the non-image areas was almost completely removed and the chromium layer lying thereunder was uncovered while the silver image areas were scarcely removed.

After rinsing in water, the photographic material was immersed in an etching solution having the following composition (20° C., 1 min.) to etch away the uncovered chromium layer.

| Etching Solution | |
|---|---|
| Cerium Ammonium Nitrate | 164.5 g |
| 70% Aqueous Perchloric Acid Solution | 43 ml |
| Water to make | 1 liter |

The thus obtained image was heat resistant and durable. Further, the thermally decomposed gelatin and silver grains remaining on the chromium layer acted as a protective layer and surface reflection preventing layer for the chromium layer. No pin holes were observed in the image.

The photographic material was immersed in a 10% aqueous sodium hypochlorite solution at 60° C. for 10 min. The silver grains remaining on the chromium layer changed to silver chloride, and the binder was removed. The silver chloride grains were completely removed by rubbing with a sponge in running water. Also, the silver grains could be removed by immersing in an aqueous solution of sodium thiosulfate.

The thus obtained chromium image was durable and resolved lines of 1μ very well. There were two pin holes having size of about 3μ in the chromium image area of about 2,5 square inchs.

EXAMPLE 2

The same procedures as described in Example 1 were followed except that a masking layer which comprised a chromium oxide ($Cr_2O_3$) layer at a thickness of about 300 Å vacuum deposited on a chromium layer vacuum deposited at a thickness of about 500 Å was used instead of the chromium layer.

Similar results as in Example 1 were obtained.

EXAMPLE 3

The same procedures as described in Example 1 were followed except that a chromium oxide ($Cr_2O_3$) layer at a thickness of about 2500 Å was used as a masking layer instead of the chromium layer and the etching time for the chromium oxide layer was 2.5 min.

Similar results as in Example 1 were obtained.

EXAMPLE 4

In Example 1 the baking temperature and the baking time were changed to 350° C. and 20 min., respectively. As a result, the binder at the non-image areas was removed in 2 min. with a 4% aqueous sodium hypochlorite solution at 20° C. After etching of the masking layer, the resist layer remaining on the masking layer was removed in 5 min. with a 5% aqueous sodium hypochlorite solution at 60° C. All other condition were as in Example 1.

The thus obtained chromium mask resolved 1μ lines but the edge of the image was slightly granular.

EXAMPLE 5

The same procedures as described in Example 1 were followed except that the silver image was converted to a mixture of silver chloride and palladium by immersing the silver image in a toning solution having the following composition (20° C., 2 min.) before baking.

The resolving power and edge smoothness of the thus obtained chromium image were superior to those obtained in Example 1.

| Toning Solution | |
|---|---|
| Palladium (II) Chloride | 0.3 g |
| Hydrochloric Acid (36%) | 3 ml |
| Water to make | 1 liter |

EXAMPLE 6

The same procedures as described in Example 5 were followed except that the silver chloride formed by toning was reduced to silver using the developer in the same manner as in Example 1.

The thus obtained chromium image had a quality similar to the quality of the product of Example 5.

EXAMPLE 7

The silver chloride formed by toning in Example 5 was removed with the fixing solution in the same manner as in Example 1, i.e., the silver image was converted to a palladium image. The photographic material was then baked in the air at 450° C. for 10 min., and then immersed in a 4 wt% aqueous sodium hypochlorite solution at 20° C. for 5 min. to remove the binder at the non-image areas. By subsequent procedures as described in Example 1, a chromium image was obtained.

The thus obtained chromium image had almost the same resolving power as that of the product of Example 5, but the edge smoothness was better than that of the product of Example 5.

EXAMPLE 8

The same procedures as described in Example 1 were followed except that the silver image was converted to a silver chloride image by immersion in a bleaching solution having the following composition (20° C., 1 min.) just before baking.

The resolving power of the thus obtained chromium image was better than that of the product of Example 1. The resist of this example was hard to remove, and it was not removed even when immersed in a 10 wt% aqueous sodium hypochlorite solution at 60° C. for 15 min. It was removed in about 30 min. under the same conditions, however.

| | |
|---|---|
| Potassium Dichromate | 10 g |
| Hydrochloric Acid (36%) | 10 ml |
| Water to make | 1 liter |

EXAMPLE 9

The same procedures as described in Example 1 were followed except that the silver image was toned with a 0.25 wt% aqueous chloroauric acid solution (20° C., 2 min.) and then the silver chloride formed by toning was reduced to silver with the developer of Example 1 just before baking.

The resolving power and edge smoothness of the thus obtained chromium image were better than those of the product of Example 1.

EXAMPLE 10

The photographic light-sensitive material as described in Example 1 was image-wise exposed and developed in the same way as in Example 1 (fixing was not conducted). The thus obtained silver image was converted to a mixture of silver chloride and gold by immersion in a 0.25 wt% aqueous chloroauric acid solution at 20° C. for 2 min. The silver halide at non-exposed areas and the silver chloride formed by toning were then removed using the fixing solution in the same manner as in Example 1, and then baking and subsequent procedures as described in Example 7 were followed to obtain a chromium image.

The resolving power and edge smoothness of the thus obtained chromium image were better than those of the product of Example 1.

This example is advantageous in comparison with Example 7 in that only one fixing process (removal of silver halide) is necessary.

EXAMPLE 11

The same procedures as described in Example 1 were followed except for coating a 0.2 to 0.3μ subbing layer having the following composition on the chromium layer using an immersion method and drying the subbing layer for 15 min. at 130° C. prior to coating the silver halide photographic emulsion thereon.

| Subbing Solution |  |
|---|---|
| A solution prepared by adding 0.45 g of nitrocellulose (nitrocellulose RS 1/8; made by Daisel Ltd.) and 10.0 g of acetone, while stirring, to a gelatin dispersion comprising: | |
| Gelatin | 0.4 g |
| Salicylic Acid | 0.12 g |
| Methanol | 0.18 g |
| Ethylene Chloride | 55.0 g |
| Acetone | 15.0 g |

Results similar to Example 1 were obtained.

EXAMPLE 12

The photographic light-sensitive material of Example 1 was image-wise exposed and developed in the same way as in Example 1 (fixing was not conducted), and then the silver image was immersed in a bleaching solution having the following composition (20° C., 30 sec.).

| Bleaching Solution | |
|---|---|
| Potassium Dichromate | 20 g |
| Sulfuric Acid (98%) | 10 ml |
| Water to make | 1 liter |

After rinsing in water and drying, the emulsion layer was exposed to uniform light (10,000 lux, 10 sec.), and then immersed in the developer of Example 1 to obtain a reversal silver image.

By following subsequent procedures as described in Example 1, a chromium image similar to that of Example 1 was obtained.

EXAMPLE 13

The same procedures as described in Example 1 were followed except that the following sputter etching was employed instead of chemical etching the chromium layer.

The photographic material to be etched was placed with the chromium layer upside on a quartz plate (diameter: about 300 mm, thickness: 5 mm) placed on a stainless steel cathode (diameter: about 300 mm). The distance between the anode and the cathode was about 70 mm. The frequency of the voltage applied was 13.56 MHz and the high frequency power was about 200 W. The gas (Freon-12, $CCl_2F_2$) pressure was about $2\times10^{-2}$ Torr.

The chromium layer was etched in 11 min. and results similar to Example 1 were obtained.

EXAMPLE 14

The same photographic material as described in Example 1 was used except for having a silicon layer at a thickness of $0.2\mu$ deposited by sputtering instead of the chromium layer. The same procedures as described in Example 1 were followed except that the following plasma etching (2 min.) was employed instead of chemical etching.

| High Frequency Plasma Etching | |
|---|---|
| Gas: | Carbon Tetrafluoride |
| Gas Pressure: | 0.1 Torr |
| High Frequency Power: | 200 W |
| Frequency: | 13.56 MHz |

Results similar to Example 1 were obtained.

EXAMPLE 15

The same photographic material as described in Example 1 except for having an aluminum layer $0.1\mu$ thick instead of the chromium layer was image-wise exposed, developed, fixed and baked in the same manner as described in Example 1. Then, the photographic material was immersed in 4 wt% aqueous sodium hypochlorite solution for 3 min. at 20° C. The binder at the non-image areas and the aluminum layer lying thereunder were removed, but the aluminum layer lying under the silver image areas of the emulsion layer was not removed.

The thus obtained image was heat resistant, but its durability was less than the chromium image obtained in Example 1.

EXAMPLE 16

The silver chloride obtained following the procedure of Example 8 was removed using the fixing solution of Example 1 in the same manner as in Example 1. The photographic material was then baked in the air at 300° C. for 20 min., and then immersed in 2 wt% aqueous sodium hypochlorite solution for 1 min. at 20° C. The thermally decomposed binder at the non-silver image areas was removed but the binder at the silver image areas was not removed. Thus, a resist pattern was obtained.

The etching of the chromium layer and further removal of the resist were conducted in the same manner as described in Example 1 to obtain a chromium pattern similar to that obtained in Example 1.

EXAMPLE 17

After forming a silver image in the same manner as in Example 1 using the element of Example 1, the silver image was re-halogenized using the same bleaching solution and conditions as Example 8. After washing and drying, the overall surface of the photographic material was uniformlly exposed to high intensity light. The thus obtained material was developed in the same manner as in Example 1 to obtain a silver image. After washing and drying at 300° C. for 15 min. in air, the material was immersed in an aqueous solution of 1% sodium hypochlorite at 20° C. for 2 min. and gelatin at non-image areas was removed while silver image areas remained to form a resist. The chromium layer was then etched in the same manner as in Example 1 to obtain a mask.

Result similar to Example 1 were obtained in Example 17 by baking at 300° C. for 15 min. as compared to the baking at 400° C. for 10 min. in Example 1.

EXAMPLE 18

The same procedures as described in Example 1 were followed except that the immersion time of the photographic material in the sodium hypochlorite aqueous solution was increased to 6 min.

The line width of the thus obtained chromium image was about $0.5\mu$ narrower than that of Example 1.

While the invention has been described in detail and with reference to specific embodiments thereof, it will be apparent to one skilled in the art that various changes and modifications can be made therein without departing from the spirit and scope thereof.

What is claimed is:

1. A method for forming an image comprising in sequence forming a silver image in the emulsion layer of a photographic material which comprises a transparent support having a masking layer thereon, said masking layer having thereon a silver halide emulsion layer, either directly or on at least one subbing layer on the masking layer, by exposing and developing said photographic material, heating said photographic material to thermally decompose the binder of the emulsion layer, selectively removing the thermally decomposed emulsion layer at non-image areas to uncover the masking layer lying thereunder using a binder-removing solution selected from the group consisting of the aqueous solutions containing sodium hypochlorite, potassium hypochlorite, sodium hypobromite, potassium hypobromite, sodium chlorite, potassium chlorite, sodium chlorate, potassium chlorate, sodium bromate and potassium bromate, and then etching away the masking layer at the uncovered areas.

2. The method of claim 1, wherein said heating is at about 250° C. to about 600° C.

3. The method of claim 1, wherein said masking layer is a layer of a metal, a metal oxide, a semi-metal a chalcogen glass or a mixture thereof.

4. The method of claim 3, wherein said metal is chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, a chromium-iron alloy, a chromium-aluminum alloy, a nickel-chromium alloy, a nickel-cobalt alloy, a cobalt-iron alloy, a silicon-gold alloy, a titanium-aluminum alloy or a copperberyllium alloy; said semi-metal is silicon or germanium; said metal oxide is chromium oxide, silicon oxide, ferric oxide, iron (II)-iron (III) oxide, cuprous oxide, cupric oxide, nickel oxide, cobalt oxide, germanium oxide, cadmium oxide, titanium oxide or tantalum oxide; said chalcogen glass is As-S-Ge, As-Se-Ge or Ge-S; and said mixture thereof is germanium-silicon, chromium oxide on chromium, cobalt oxide on cobalt or silicon oxide on silicon.

5. The method of claim 1, wherein said masking layer has a thickness ranging from about 0.01 micron to about 10 microns.

6. The method of claim 1 further comprising intensifying and/or toning said silver image prior to said heating.

7. The method of claim 6, wherein said intensifying or toning is selected from the group consisting of mercury intensification, dichromate intensification, copper intensification, lead intensification, uranium toning, selenium toning, sulfur toning, iron toning, nickel toning, cobalt toning, copper toning, vanadium toning, titanium toning, lead chromate toning, cadmium toning and noble metal toning.

8. The method of claim 1, wherein said etching of said masking layer is by chemical etching.

9. The method of claim 1, wherein said etching of said masking layer is by plasma etching.

10. The method of claim 1, wherein said etching of said masking layer is by ion etching.

11. The method of claim 1 further comprising removing the emulsion layer at the image areas to leave the masking layer lying thereunder.

12. The method of claim 1, wherein said support transmits not less than 50% of electromagnetic waves having wavelengths between about 2900 Å and 7500 Å.

13. The method of claim 12 wherein said support transmits not less than 70% of electromagentic waves having wavelengths between about 2900 Å and 7500 Å.

14. The method of claim 1, wherein said masking material masks ultraviolet and/or visible light.

15. The method of claim 5, wherein said masking layer has a thickness ranging between about 0.05 to about 1.5 microns.

16. The method of claim 1, wherein there is a subbing layer between said masking layer and said silver halide emulsion layer.

17. The method of claim 1, wherein said silver halide emulsion layer has a thickness ranging between about 0.03 to about 10 microns.

18. The process of claim 1 which consists essentially of the steps recited.

19. A method for forming an image comprising in sequence forming a silver halide image in the emulsion layer of a photographic material which comprises a transparent support having a masking layer thereon, said masking layer having thereon a silver halide emulsion layer, either directly or on at least one subbing layer on the masking layer, by exposing and developing said photographic material and bleaching said material with a suitable bleaching solution to form said silver halide image, heating said photographic material to thermally decompose the binder of the emulsion layer, selectively removing the thermally decomposed emulsion layer at non-image areas to uncover the masking layer thereunder using a binder-removing solution selected from the group consisting of the aqueous solutions containing sodium hypochlorite, potassium hypochlorite, sodium hypobromite, potassium hypobromite, sodium chlorite, potassium chlorite, sodium chlorate, potassium chlorate, sodium bromate and potassium bromate, and then etching away the masking layer at the uncovered areas.

20. The method of claim 19, wherein said heating is at about 250° C. to about 600° C.

21. The method of claim 19, wherein said masking layer is a layer of a metal, a metal oxide, a semi-metal a chalcogen glass or a mixture thereof.

22. The method of claim 21, wherein said metal is chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, a chromium-iron alloy, a chromium-aluminum alloy, a nickel-chromium alloy, a nickel-cobalt alloy, a cobalt-iron alloy, a silicon-gold alloy, a titanium-aluminum alloy or a copper-beryllium alloy; said semi-metal is silicon or germanium; said metal oxide is chromium oxide, silicon oxide, ferric oxide, iron (II)-iron (III) oxide, cuprous oxide, cupric oxide, nickel oxide, cobalt oxide, germanium oxide, cadmium oxide, titanium oxide or tantalum oxide; said chalcogen glass is As-S-Ge, As-Se-Ge or Ge-S; and said mixture thereof is germanium-silicon, chromium oxide on chromium, cobalt oxide on cobalt or silicon oxide on silicon.

23. The method of claim 19, wherein said masking layer has a thickness ranging from about 0.01 micron to about 10 microns.

24. The method of claim 19, further comprising intensifying and/or toning said silver halide image prior to said heating.

25. The process of claim 24 which consists essentially of the steps recited.

26. The method of claim 24, wherein said intensifying or toning is selected from the group consisting of mercury intensification, dichromate intensification, copper intensification, lead intensification, uranium toning, selenium toning, sulfur toning, iron toning, nickel toning, cobalt toning, copper toning, vanadium toning, titanium toning, lead chromate toning, cadmium toning and noble metal toning.

27. The method of claim 19, wherein said etching of said masking layer is by chemical etching.

28. The method of claim 19, wherein said etching of said masking layer is by plasma etching.

29. The method of claim 19, wherein said etching of said masking layer is by ion etching.

30. The method of claim 19, further comprising removing the emulsion layer at the image areas to leave the masking layer lying thereunder.

31. The method of claim 19, wherein said support transmits not less than 50% of electromagnetic waves having wavelengths between about 2900 Å and 7500 Å.

32. The method of claim 31 wherein said support transmits not less than 70% of electromagentic waves having wavelengths between about 2900 Å and 7500 Å.

33. The method of claim 19 wherein said masking material masks ultraviolet and/or visible light.

34. The method of claim 23, wherein said masking layer has a thickness ranging between about 0.05 to about 1.5 microns.

35. The method of claim 19 wherein there is a subbing layer between said masking layer and said silver halide emulsion layer.

36. The method of claim 19 wherein said silver halide emulsion layer has a thickness ranging between about 0.03 to about 10 microns.

37. The process of claim 19 which consists essentially of the steps recited.

38. A method for forming an image comprising in sequence forming a binder image in the emulsion layer of a photographic material which comprises a transparent support having a masking layer thereon, said masking layer having thereon a silver halide emulsion layer, either directly or on at least one subbing layer on the masking layer, by exposing and developing said photographic material and bleaching said material with a suitable bleaching solution to form said binder image, heating said photographic material to thermally decompose the binder of the emulsion layer, selectively removing the thermally decomposed emulsion layer at non-image areas to uncover the masking layer lying thereunder using a binder-removing solution selected from the group consisting of the aqueous solutions containing sodium hypochlorite, potassium hypochlorite, sodium hypobromite, potassium hypobromite, sodium chlorite, potassium chlorite, sodium chlorate, potassium chlorate, sodium bromate and potassium bromate, and then etching away the masking layer at the uncovered areas.

39. The method of claim 38, wherein said heating is at about 250° C. to about 600° C.

40. The method of claim 38, wherein said masking layer is a layer of a metal, a metal oxide, a semi-metal a chalcogen glass or a mixture thereof.

41. The method of claim 40, wherein said metal is chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, a chromium-iron alloy, a chromium-aluminum alloy, a nickel-chromium alloy, a nickel-cobalt alloy, a cobalt-iron alloy, a silicon-gold alloy, a titanium-aluminum alloy or a copper-beryllium alloy; said semi-metal is silicon or germanium; said metal oxide is chromium oxide, silicon oxide, ferric oxide, iron (II)-iron (III) oxide, cuprous oxide, cupric oxide, nickel oxide, cobalt oxide, germanium oxide, cadmium oxide, titanium oxide or tantalum oxide; said chalcogen glass is As-S-Ge, As-Se-Ge or Ge-S; and said mixture thereof is germanium-silicon, chromium oxide on chromium, cobalt oxide on cobalt or silicon oxide on silicon.

42. The method of claim 38, wherein said masking layer has a thickness ranging from about 0.01 micron to about 10 microns.

43. The method of claim 24, wherein said intensifying or toning is selected from the group consisting of mercury intensification, dichromate intensification, copper intensification, lead intensification, uranium toning, selenium toning, sulfur toning, iron toning, nickel toning, cobalt toning, copper toning, vanadium toning, titanium toning, lead chromate toning, cadmium toning and noble metal toning.

44. The method of claim 38, wherein said etching of said masking layer is by chemical etching.

45. The method of claim 38, wherein said etching of said masking layer is by plasma etching.

46. The method of claim 38, wherein said etching of said masking layer is by ion etching.

47. The method of claim 38, further comprising removing the emulsion layer at the image areas to leave the masking layer lying thereunder.

48. The method of claim 38 wherein said support transmits not less than 50% of electromagnetic waves having wavelengths between about 2900 Å and 7500 Å.

49. The method of claim 48 wherein said support transmits not less than 70% of electromagentic waves having wavelengths between about 2900 Å and 7500 Å.

50. The method of claim 38 wherein said masking material masks ultraviolet and/or visible light.

51. The method of claim 42 wherein said masking layer has a thickness ranging between about 0.05 to about 1.5 microns.

52. The method of claim 38 wherein there is a subbing layer between said masking layer and said silver halide emulsion layer.

53. The method of claim 38 wherein said silver halide emulsion layer has a thickness ranging between about 0.03 to about 10 microns.

54. The process of claim 38, which consists essentially of the steps recited.

* * * * *